(12) United States Patent
Draper et al.

(10) Patent No.: US 7,945,845 B2
(45) Date of Patent: May 17, 2011

(54) MAXIMUM LIKELIHOOD DECODING VIA MIXED-INTEGER ADAPTIVE LINEAR PROGRAMMING

(75) Inventors: Stark C. Draper, Newton, MA (US); Jonathan S. Yedidia, Cambridge, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 1001 days.

(21) Appl. No.: 11/764,938

(22) Filed: Jun. 19, 2007

(65) Prior Publication Data
US 2008/0316069 A1    Dec. 25, 2008

(51) Int. Cl.
*H03M 13/03* (2006.01)
(52) U.S. Cl. .................. 714/794; 714/769; 714/755
(58) Field of Classification Search .................. 714/794, 714/769, 755, 791, 795, 796, 780, 746, 786
See application file for complete search history.

(56) References Cited

U.S. PATENT DOCUMENTS

| | | | | |
|---|---|---|---|---|
| 6,405,342 B1* | 6/2002 | Lee | .............. | 714/792 |
| 6,604,220 B1* | 8/2003 | Lee | .............. | 714/769 |
| 7,405,678 B2* | 7/2008 | Cherubini | ............ | 341/51 |

OTHER PUBLICATIONS

J. Feldman, M. J. Wainwright, and D. Karger, "Using linear programming to decoding binary linear codes," IEEE Trans. Inform. Theory, 51:954-972, Mar. 2005.
M. H. Taghavi N. and P. H. Siegel, "Adaptive linear programming decoding," In Proc. Int. Symp. Inform. Theory, pp. 1374-1378, Jul. 2006.

* cited by examiner

*Primary Examiner* — Fritz Alphonse
(74) *Attorney, Agent, or Firm* — Dirk Brinkman; Gene Vinokur

(57) ABSTRACT

A method and system decode a sequence of symbols received via a channel to a codeword of an error-correcting code. Log-likelihood ratios are determined from a sequence of symbols received via a channel. A set of constraints is initialized according to the log-likelihood ratios. An adaptive linear programming decoder is applied to the set of constraints and the log- likelihood ratios according to an error-correcting code to produce an estimate of the codeword and an updated set of constraints. If the estimate of the codeword is a non-integer pseudo codeword, further update the set of updated constraints with a set of integer constraints if the estimate of the codeword is the non-integer pseudo codeword, and proceeding with the applying step, and otherwise producing the estimate of the codeword as the final codeword.

6 Claims, 6 Drawing Sheets

| # bit flips | 12 | 14 | 16 | 18 | 20 |
|---|---|---|---|---|---|
| average time (all sims) | 0.14 | 0.22 | 0.87 | 8.32 | 114 |
| average time (correct dec) | 0.14 | 0.22 | 0.85 | 7.17 | 75 |
| average time (erroneous dec) | 1.40 | 2.66 | 11.75 | 84.25 | 461 |
| median time (all sims) | 0.12 | 0.15 | 0.23 | 1.33 | 20.6 |
| median time (correct dec) | 0.12 | 0.15 | 0.23 | 1.29 | 16.4 |
| median time (erroneous dec) | 0.85 | 1.18 | 3.93 | 28.09 | 162 |

MAXIMUM LIKELIHOOD DECODING VIA MIXED-INTEGER ADAPTIVE LINEAR PROGRAMMING

FIELD OF THE INVENTION

This invention relates generally to decoding codewords of an error-correcting code, and more particularly to optimally decoding codewords using linear programming.

BACKGROUND OF THE INVENTION

Data communication systems often use binary linear codes to offset the effect of noise. The ideal goal is to reach the Shannon limit of a communication channel. The Shannon limit is the highest rate of error-free transmission possible over a communication channel.

One class of codes that exhibit very good performance is low-density parity-check (LDPC) codes. Conventional decoders for LDPC codes are based on iterative belief-propagation (BP) decoding. An alternate decoding method is based on linear programming (LP), J. Feldman, M. J. Wainwright, and D. Karger, "Using linear programming to decoding binary linear codes," IEEE Trans. Inform, Theory, 51:954-972, March 2005, incorporated herein by reference.

LP decoding has some attractive features. An LP decoder deterministically converges, and when the decoder converges to an integer solution, one knows that the optimal maximum likelihood (ML) codeword has been found. When LP decoding converses to a non-integer solution, a well-defined non-integer "pseudo codeword" has been found. Unfortunately, LP decoding is more complex than BP decoding. In the formulations originally described by Feldman et al., the number of constraints in the LP decoding problem grows exponentially with the maximum check node degree, and the resulting computational load can be prohibitive.

The very large computational burden of LP decoding has motivated the introduction of adaptive linear programming (ALP) decoding, M. H. Taghavi N. and P. H. Siegel, "Adaptive linear programming decoding," In Proc. Int. Symp. Inform. Theory, pages 1374-1378, July 2006, incorporated herein by reference. Instead of starting with all of the LP constraints, they first solve for the LP optimum of a problem where the values of the binary codeword symbols are only constrained to be greater than zero and less than one. At the resulting optimum, for each check node, they determine the local constraints that are violated. Adding the violated constraints back into the problem, they then solve the resulting LP. They iterate this process until no local constraints are violated. The result is guaranteed to exactly match the solution to the original LP, even though only a small fraction of the original constraints are used. They observe that the number of constraints used for linear codes is only a small multiple (1.1-1.5) of the number m of parity-checks, even for codes with high check degree, and that ALP decoding is significantly, sometimes several orders of magnitude, more efficient, than standard LP decoding.

Details of Linear Programming and Adaptive Linear Programming Decoders

Suppose that the code that must be decoded is a length-n binary linear code C. Assume that a binary codeword x∈C is transmitted from a source to a destination, over a memoryless communication channel. The destination receives a codeword y, which is a version of the codeword x that has been distorted by the channel. Pr[x̂|y] is the probability that: a particular codeword x̂∈C was sent, given, that y is received. If all the codewords are equally likely to be sent, then the ML decoding problem reduces to the following problem:

$$\text{Minimize} \sum_i \gamma_i \hat{x}_i \quad (1)$$

$$\text{subject to the constraint } \hat{x} \in C, \quad (2)$$

where $\gamma_i$ is the ith negative log-likelihood ratio defined as $$\gamma_i = \log\left(\frac{Pr[y_i \mid x_i = 0]}{Pr[y_i \mid x_i = 1]}\right). \quad (3)$$

Here $\hat{x}_i$ is the ith symbol of the candidate codeword $\hat{x}$, $y_i$ is the ith symbol of the received sequence y, and $x_i$ is the ith symbol of the transmitted codeword x. For example, if the channel is a binary symmetric channel (BSC) with bit-flip probability p, then $\gamma_i = \log(p/(1-p))$ if the received bit $y_i = 1$, and $\gamma_i = \log((1-p)/p)$ if the received bit $y_i = 0$. The appropriate negative log-likelihood ratios $\gamma_i$ can be calculated for other channels as well.

The constraints (2) for the minimization problem (1) are binary. Feldman et al. introduced the idea of solving a relaxed version of this minimization problem in which the binary constraints of (2) are replaced by more tractable constraints over continuous variables. Specifically, the symbols $\hat{x}_i$ are allowed to take any value between and including 0 and 1. This relaxed version of the minimization problem is a linear program.

Each parity check in the code C implies a number of local linear constraints that codewords of that code must satisfy. The intersection of these constraints defines a "polytope" over which a linear programming (LP) decoder operates. The polytope has both integer and non-integer vertices. An integer vertex is one in which for all i, $\hat{x}_i$ is 0 or 1, while a non-integer vertex is one that includes $\hat{x}_i$ values that are greater than 0 and less than 1.

The integer vertices of the polytope correspond to codeword in C. When the LP optimum is at an integer vertex. Equation (2) is satisfied and the ML solution is found, even though only a relaxed version of the minimization problem was solved. However, when the LP optimum is at a non-integer vertex. Equation (2) is not satisfied and the LP solution is not the ML codeword. Such non-integer solutions are termed "pseudo codewords."

The precise form of the parity check constraints that define the polytope used by Taghavi, et al. is as follows. First, for all bits i, $\hat{x}_i$ is continuous-valued and satisfies the inequalities $$0 \leq \hat{x}_i \leq 1. \quad (4)$$

Then, for every check j=1, ..., m, every configuration of the set of neighboring variables $N(j) \subset \{1, 2, ..., n\}$ must satisfy the following parity-check inequality constraint: for all subsets $\Omega \subseteq N(j)$ such that $|\Omega|$ is odd, $$\sum_{i \in \Omega} \hat{x}_i - \sum_{i \in M(j)/\Omega} \hat{x}_i \leq |\Omega| - 1. \quad (5)$$

Taghavi et al. define a violated constraint as a "cut." The iterative ALP decoding method starts with the vertex obtained by solving a simple initial problem that only includes a small number of all the LP constraints, and iteratively adds violated constraints and re-solves until no constraints are violated. Taghavi et al. show that violated constraints can be sorted and found efficiently.

The simple initial problem consists of using only the constraints $0 \leq \hat{x}_i$ if $\gamma_i > 0$, $\hat{x}_i \leq 1$ if $\gamma_i < 0$. (6)

The optimum solution of this simple initial problem is immediately found by hard-decision decoding.

As shown in FIG. 5, the conventional ALP method operates as follows;

Initialize 510 the initial problem using the constraints in Equation (6);

Perform 520 LP decoding;

Find 530 all violated constraints of the current solution;

If one or more violated constraints are found, then add 540 the violated constraints to the problem constraints, and go to step 2 if true); and Otherwise, if false, then the current solution, is an estimate of the final ALP codeword 541.

The ALP decoding method obtains the same codewords or pseudo codewords as standard LP decoders, the only difference is that ALP decoders consume less time.

When the solution of LP or ALP decoder is non-integer, the ML codeword has not been found, and one is motivated to find a tightening of the original LP relaxation.

One method of tightening the original LP relaxation is to introduce additional linear constraints that result from redundant parity-check equations. That approach is described by Feldman et al., "Using linear programming to decoding binary linear codes," and Taghavi et al., "Adaptive linear programming decoding." Not all redundant parity-check equations improve performance. Therefore, one must search for useful redundant parity-check equations. The computational load of that search, and the quality of the search results, have a large impact on the usefulness of the resulting algorithm. So far, those approaches have not yielded a useable ML decoder.

Another method enforces a set of integer constraints. That approach is described by Feldman et al, "Using linear programming to decoding binary linear codes," and by K. Yang, J. Feldman, and X. Wang, "Nonlinear programming approaches to decoding low-density parity-check codes, IEEE J. Select, Areas Commun. 24; 1603-1613, August 2006. A mixed-integer LP solver is used, but complexity constraints keep the applicability of that method to short block-lengths. Feldman et al. only describes decoding results for a block-length, up to 60 bits, and word error rates down to only $10^{-4}$.

Another related method is the augmented BP approach, N. Varnica, M. Fossorier, and A. Kavcic, "Augmented belief-propagation decoding of low-density parity check codes," IEEE Trans. Commun, Volume 54, Issue 10, pages 1896-1896, October 2006. They start with BP, and progressively fix the least certain bits. However, because that method uses BP, the decoder may not succeed in returning a codeword in a reasonable amount of time, and if it does return a codeword, it is not guaranteed to be the optimal ML codeword.

None of the prior-art decoding methods have provided a decoding method capable of performing optimal ML decoding of LDPC codes with long block-lengths (e.g., block-lengths greater than 100) in a reasonable amount of time, e.g., to be able to produce ML decoding results for word error rates down to $10^{-6}$ or less. Such a decoding method is strongly desired.

SUMMARY OF THE INVENTION

The embodiments of the invention provide an optimal maximum-likelihood (ML) decoder that uses an adaptive LP decoder as a component. Whenever the adaptive LP decoder returns a pseudo codeword rather than a codeword, an integer constraint is added to the least certain symbol of the pseudo codeword. More generally a set of integer constraints can be added.

For some codes, and especially in the high-SNR error floor regime, only a few integer constraints are required to force the resultant mixed-integer LP to the ML solution. For example, the invention can efficiently and optimally decode, throughout the entire noise regime of practical interest, a (155, 64) LDPC code. The (155, 64) LDPC code has $2^{64}$ codewords, which is clearly far too great a number to search using any conventional method.

In contrast to some prior art decoders, which focus on adding redundant parity-checks to LP decoders, the present method adds a small number of integer constraints to the decoding problem. Also in contrast to some prior art that add integer constraints, the method integrates selected integer constraints into an adaptive linear programming decoder.

The methodology for selecting each binary constraint is as follows. The "least certain" symbols of the optimum pseudo codeword are selected. In very many cases, only a few integer constraints are needed to force the decoder to the ML solution.

The unexpected effect of the present methodology is particularly striking in the low-noise regime. For example for the (155, 64) LDPC code, the error-rate is decreased by a factor of about a million times compared to both conventional LP decoding and the conventional belief propagation (BP) decoding. What is most unexpected is that in this low noise regime, the increase in decoding time required by the ML method according to the embodiments of the invention, as compared to the conventional LP decoding, is negligible. Therefore, the invention makes ML decoding practical for much longer block-lengths, even when implemented on conventional general-purpose processors.

DETAILED DESCRIPTION OF THE PREFERRED EMBODIMENTS

Method Overview

Figure 6:
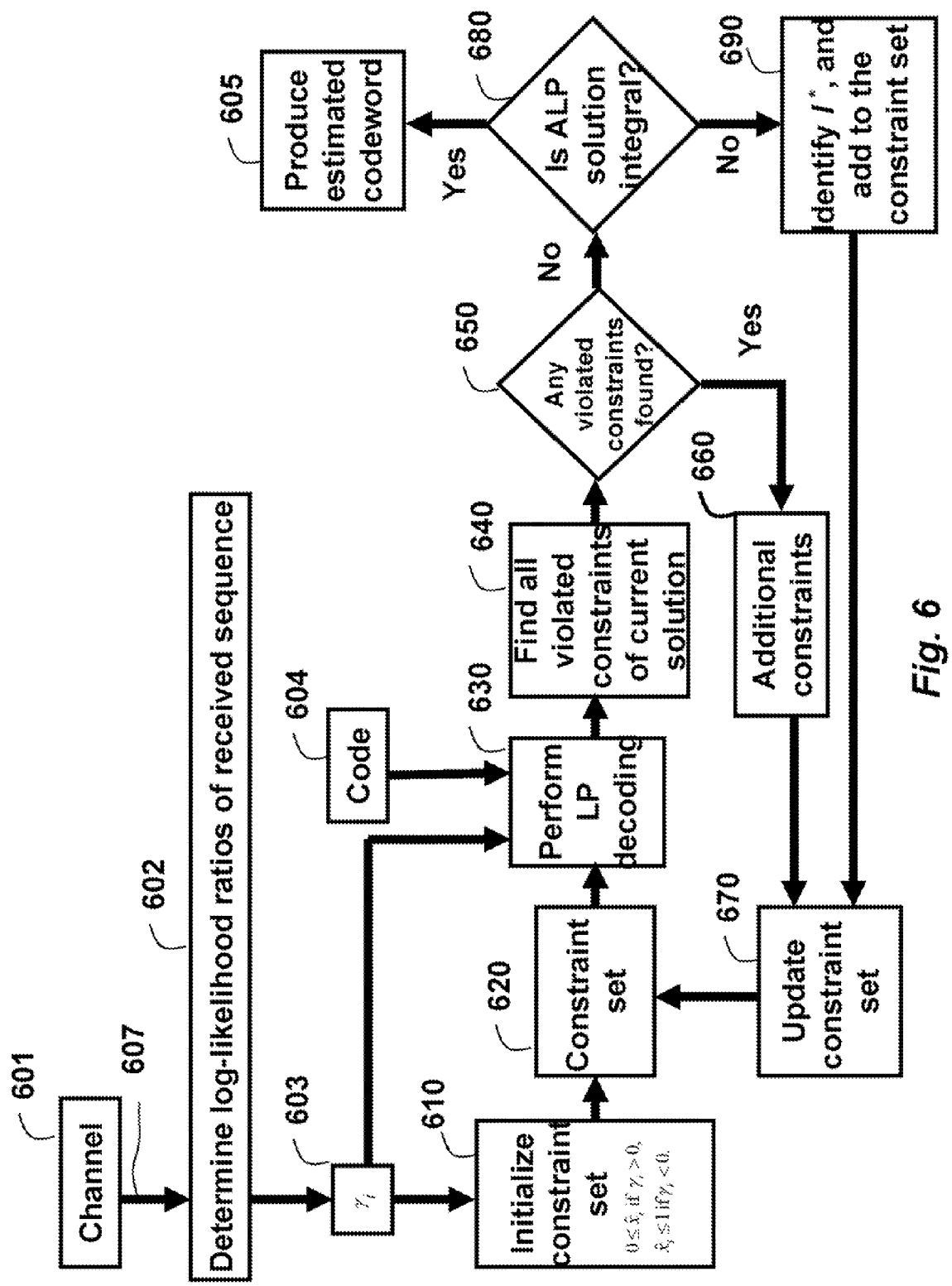
FIG. 6 is a flow diagram of a maximum likelihood decoding using adaptive linear programming decoding according to an embodiment of the invention.

FIG. 6 shows a method for decoding a sequence of symbols 607 received via a channel 601 to a codeword 605 of an error-correcting code 604 according to out invention. We begin with a sequence of symbols received via a channel 601.

We presume that the channel can corrupt the symbols because of noise and other factors. Therefore, we use the error correcting code.

From the sequence of symbols we determine 602 log-likelihood ratios 603. We use the log-likelihood ratios to initialize 610 a set of constraints 620 for use in our adaptive linear programming decoder. The ALP decoder includes a number of procedures: a LP decoder 630 and a procedure for applying the current solution to the code 604 to find all violated constraints. If violated constraints are found 650, then the corresponding additional constraints 660 are used to update 670 the constraint set 620.

When no further violated constraints are found 650, then the result is an estimated ALP codeword. If this estimate codeword is not integral 680, then integer constraints I* are identified 690. The integer constraints are used to update 670 the constraint set 620. Otherwise, if the ALP solution is integral, the decoding has converged to the ML solution. In this case, the current ALP solution is the final estimated codeword 605.

We now describe our decoding method in greater detail.

Optimal ML Decoding Via Mixed Integer Adaptive LP Decoding

When an adaptive linear programming (ALP) decoder fails, it returns a "pseudo codeword," Recall that pseudo codewords are non-integer vertices of the feasible polytope. If the ALP decoder converges to such a vertex, then we know that the ML codeword has not been found. Therefore, we therefore add additional integer constraints.

If the ALP decoder fails to find the ML solution, then we add 670 an integer constraint 660. We identity the symbol $\hat{x}_i$ whose value is closest to 0.5, as a least certain symbol. The index i*, of the symbol $\hat{x}_i$ is $$i^* = \arg_i \min |\hat{x}_i - 0.5|. \quad (7)$$

Then, we add the constraint $\hat{x}_i$, $\in \{0, 1\}$ to the problem, which is now a mixed integer-LP problem and repeat the ALP decoding. If the LP solver 630 does not accommodate integer constraints, then the integer constraint can still be added as follows, solve the LP problem separately for each of the two possible values of $x_i$, and then select the more likely solution.

After solving the problem including the integer constraint, our solution may still be a pseudo codeword, in which case another integer constraint 680 is added 670, again for the least-certain symbol of the pseudo-codeword solution.

The complexity of a mixed-integer linear program grows exponentially with the number of enforced integer constraints. Therefore, our method will succeed in decoding in a reasonable time if and only if the required number of added integer constraints is relatively small. Fortunately for some codes, notably LDPC codes in low-noise applications, a relatively small number of integer constraints are required. Thus, we can obtain a practical and optimal ML decoder, even though the general ML decoding problem is NP-hard.

Overview of Results

We describe results of using our mixed-integer ALP method on a (N=155, k=64, d=20) LDPC code as described by R. M. Tanner, D. Sridhara, and T. Fuja, "A class of group-structured LDPC codes." In Proc. ICSTA, Ambleside, UK, 2001, incorporated herein by reference. This LDPC code has an excellent minimum distance for its dimension and block-length. However, the code has pseudo codewords that greatly impair the performance of a BP or LP decoder. Our method, in contrast with prior-art methods such as "augmented BP," results in a ML decoder, which provably gives optimal performance and avoids the negative effects of the pseudo code-words.

Figure 2:
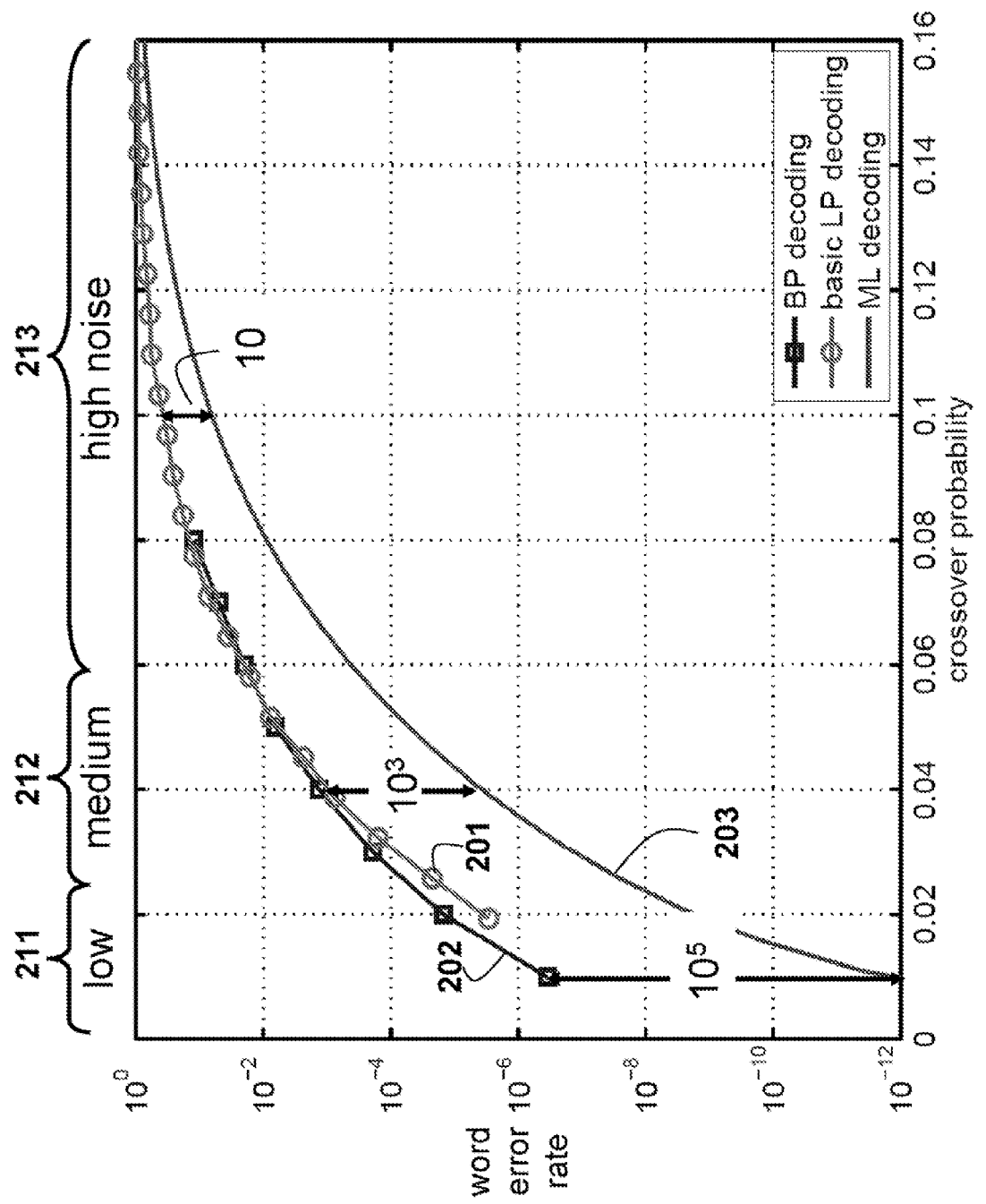
FIG. 2 is a graph comparing the word error rate as a function of crossover probability of conventional LP decoding, conventional BP decoding, and the ML decoding according to an embodiment of the invention.

FIG. 2 summarized the performance improvement of our approach for a binary-symmetric channel. We compare the word-error rate (WER) of LP decoding 201 using "conventional" ALP decoding, i.e., the ALP relaxation of Equations (6) and (7) without any additional integer constraints, to conventional BP decoding, and to ML decoding 203 obtained using our mixed-integer ALP decoder as shown in FIG. 6. We categorize the noise levels as low-noise (small cross-over probability) 211, medium-noise 212, and high-noise (large cross-over probability) 213.

The improvement in WER of ML decoding compared to LP or BP is about $10^5$ in the middle of the low-noise level. In the low; end of the low-noise regime the improvement can be a factor of a million or better. In the middle and high-noise levels the improvement is $10^3$ and 10, respectively. What is even more startling is that these improvements can be obtained by negligible increase in computational complexity incurred by our method. It should also be noted in contrast with the prior art, that our method does not fail at higher crossover probabilities.

Figure 3:
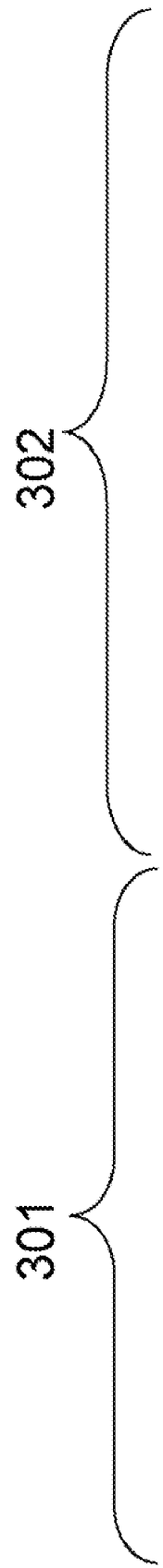
FIG. 3 is a table of statistics on the computation time requirements of the ML decoder according to an embodiment of the invention as a function of the number of bit flips.

FIG. 3 summarized the decoding time statistics versus the number of bit flips. The rows listed in column 301 indicate the type of statistic, and columns 302 the result for that statistic categorized by the number of bit flips. For 12, 14, and 16 bit flips, the average decoding times of LP decoding are 0.12, 0.15, and 0,23 seconds respectively. For our method of ML decoding via mixed-integer ALP, the corresponding average decoding times are 0.14, 0,22, 0.87 seconds. With our method, five to six orders magnitude in improvements in WER require very little increase in the average decoding time.

Details of Experimental Results

We also describe the number of ALP iterations needed to obtain to the ML solution, the number of binary constraints required, and provide statistics on the computation time requirements of our ML decoder.

While we simulate code performance for the binary-symmetric channel, we note that our decoder also works on other channels, such as an additive-white Gaussian noise (AWGN) channel. The minimum distance of the (155, 64) LDPC code is 20. Therefore, the ML decoder is guaranteed to succeed if nine or fewer bits are flipped. When ten or more bits are flipped, the ML decoder may fail because another codeword is more likely than the transmitted codeword. We find that the number of required integer constraints and ALP decoding iterations grows with the number of bit flips, but is manageable for all bit flips up to 23. We employ a cap of 200 ALP decoding iterations (defined as the overall number of linear programs solved—pure linear programs or mixed-integer LPs) before giving up on a particular received word as taking too long to decode.

Figure 1:
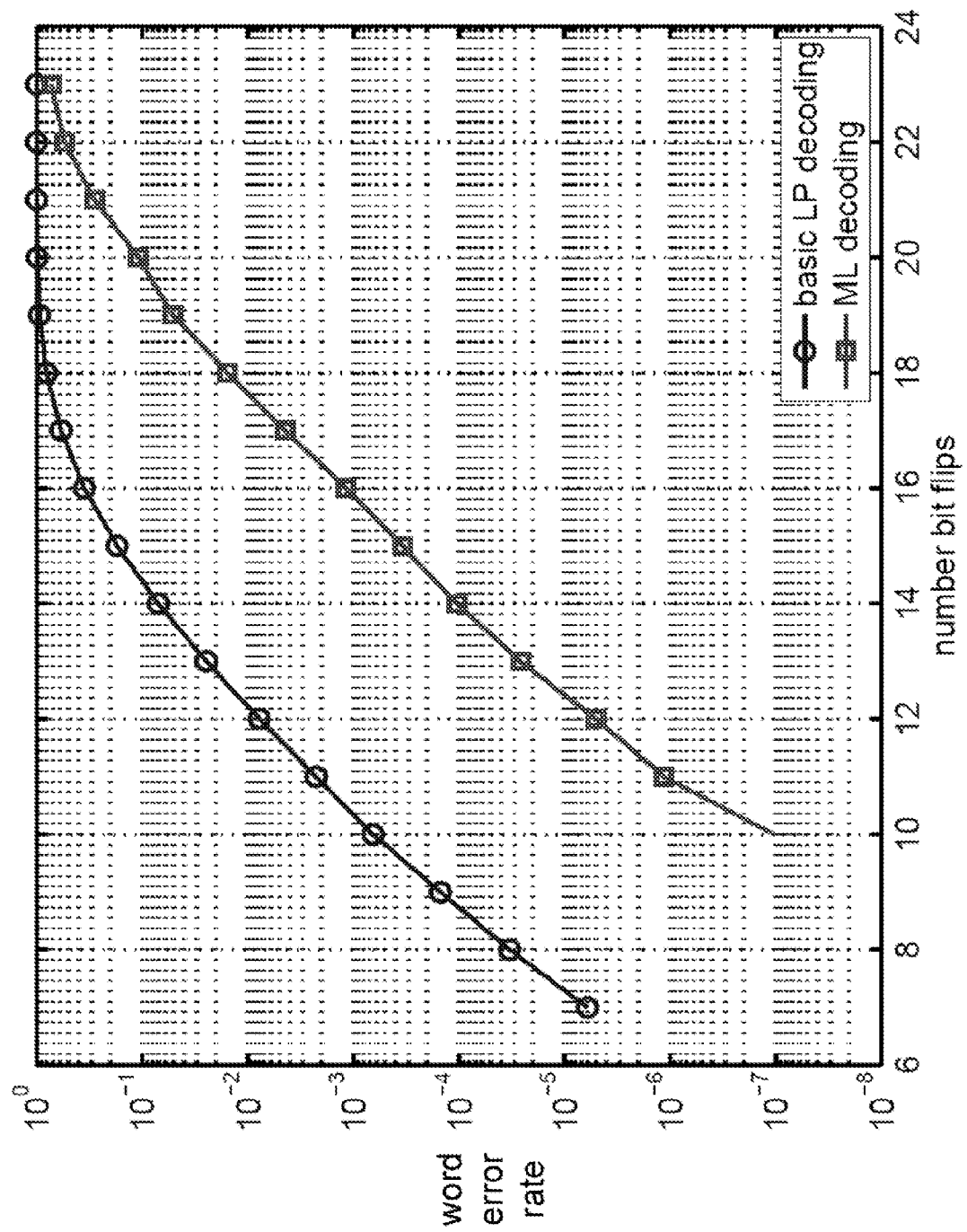
FIG. 1 is a graph comparing the word error rate as a function of bit flips of conventional LP decoding, and the ML decoding according to an embodiment of the invention.

The rate of the (155, 64) code is 0.4129. If we could operate near capacity, then we could only expect to correct about 22 bit flips. To simplify our analysis as shown in FIG. 2, we estimate the error rate at a number of noise levels, each corresponding to a fixed number of bit flips. We simulate up to 23 bit flips and simply assume decoding will fail, with probability 1 for the very high noise regime of more than 23 bit flips. This is slightly pessimistic given that the ML word-error rate (WER) is about "only" 0.73 for 23 bit flips but is also realistic given that for 24 or more bit flips the decoder runs very slowly. We perform decoding experiments at each number of bit-flips from 23 down, to 12, until we accumulated 200 ML decoding errors at each bit-flip level. The WERs resulting from these experiments are shown in FIG. 1.

For 10 and 11 bit flips, the ML decoder performs very well. However, it is difficult to obtain enough failures through simulation. At 11 bit flips, we accrued only 79 ML decoding errors. Therefore, we estimate the performance as follows. We start by noting that, e.g., in a 12-bit flip failure, at least 10 of the flips must overlap another codeword, or else the ML decoder would decode to the codeword that was transmitted. Empirically, nearly all failures are produced when exactly 10 bits overlap; 11 bit and 12 bit overlaps are much less likely. In such a case, we start with a 12 bit failure pattern and reduce by one the number of bit flips. Then, the probability that we take away one of the two (non-overlapping) bits so that we would still have a failure is (2/12). The resulting estimated error probability of $8.3 \times 10^{-7} = (2/12) \; 5.9 \times 10^{-6}$ for 11 bit flips is in rough agreement with our experimental observation of $1.1 \times 10^{-6}$ based on only 79 decoding failures. We use the same idea to estimate the WER at 10 bit flips to be ($\frac{1}{11}$)th of the estimated WER at 11 bit flips.

To generate FIG. 2, we need to estimate the ML WER for a range of crossover probabilities. To make these estimates, we again note that the WER is zero for nine or fewer bit flips and assume that the WER equals one for 24 or more bit flips. We then calculate the probability of realizing each number of bit flips for a particular crossover probability and average the empirical WERs at fixed number of bit flips by the appropriate binomial coefficient. The combination of knowing that no ML errors occur for nine or fewer bit flips, and the error statistics for larger number of bit flips, allows us to estimate ML performance down to much lower WERs than, would be possible if we generated the number of bit flips stochastically.

Another quantity of interest is the time requirement of our mixed-integer ALP decoding. FIG. 3 shows a table of statistics on decoding time to produce our results. The first row indicates the number of bit flips, and subsequent rows indicate average and median decoding times for all simulations, correct decoding and erroneous decodings, respectively.

Figure 4:
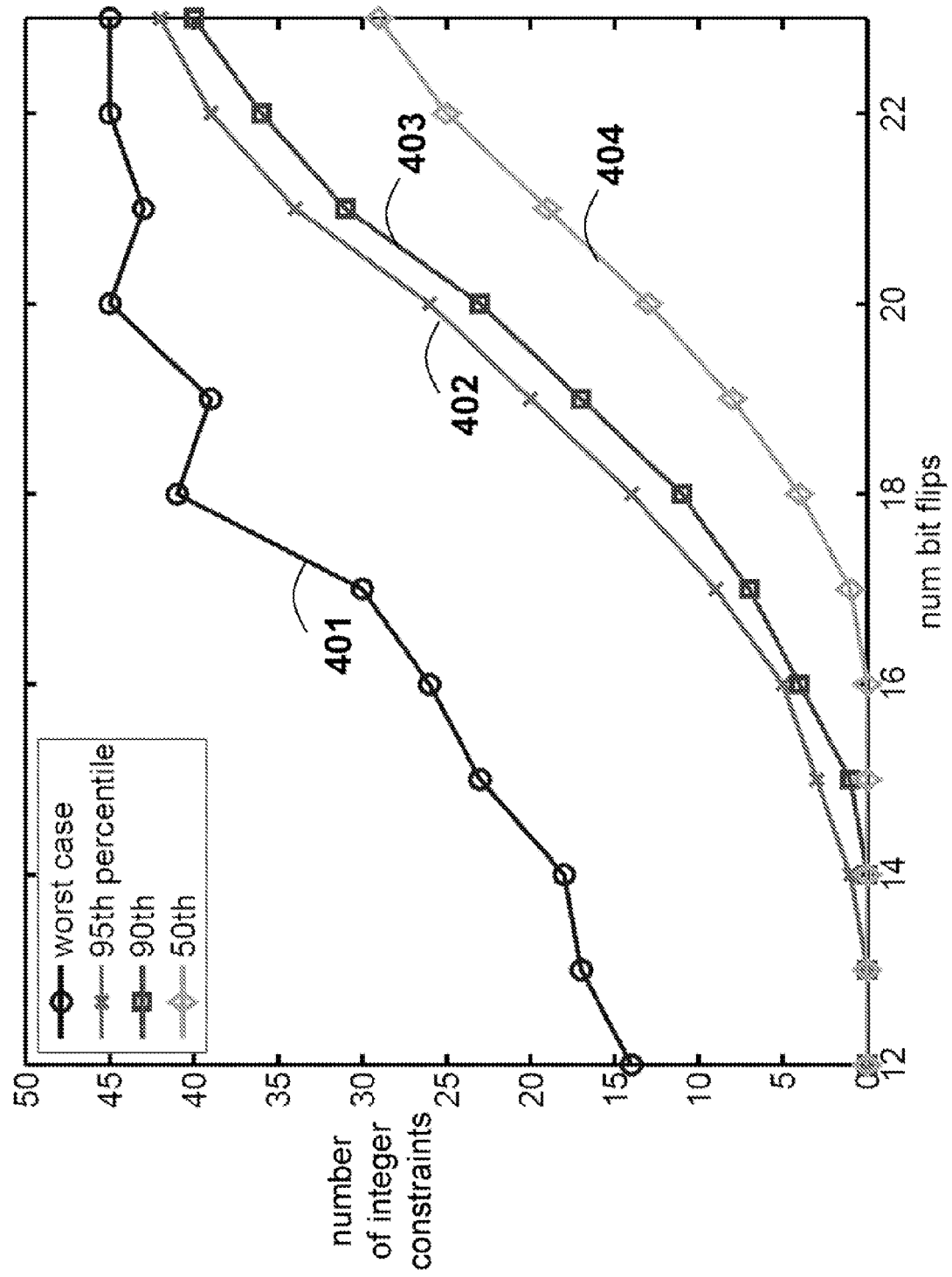
FIG. 4 is a graph of the number of binary constraints as a function of the number of bit flips according to an embodiment of the invention.
Figure 5:
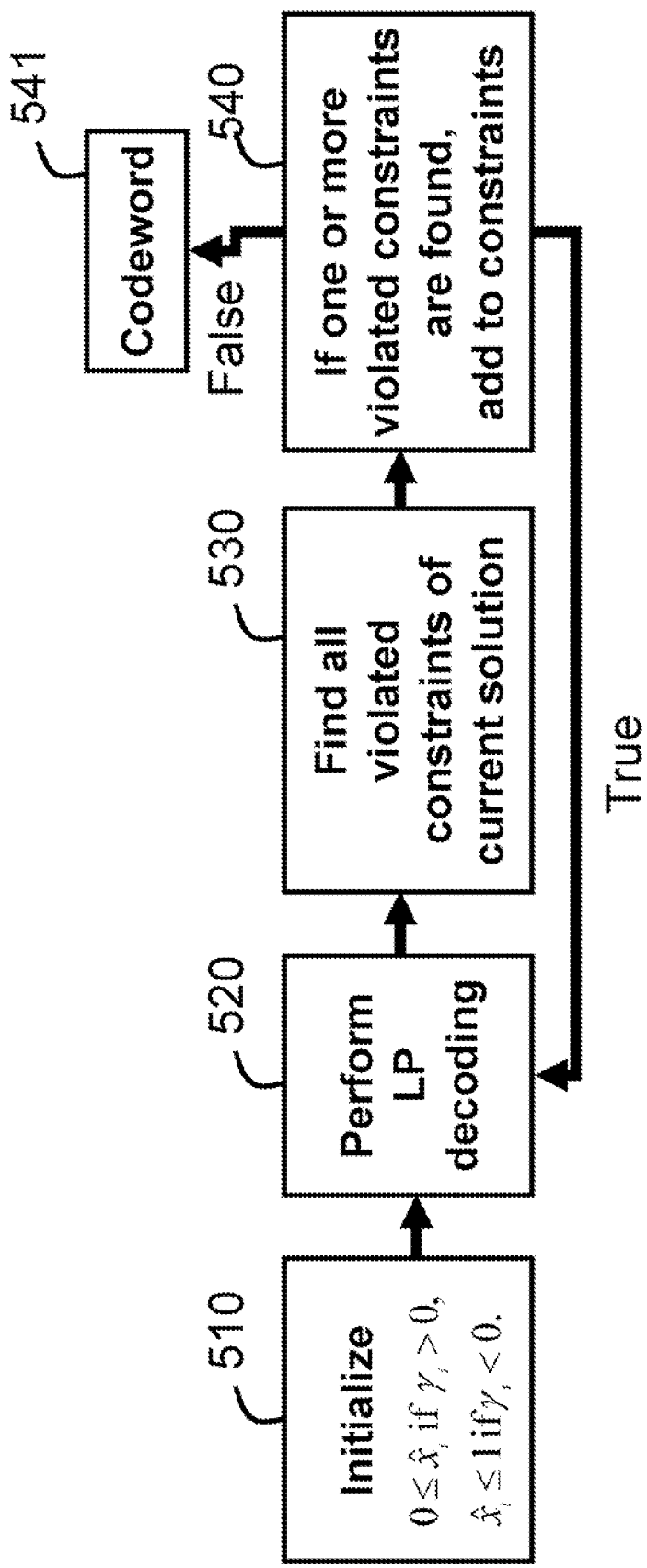
FIG. 5 is a flow diagram of a prior art adaptive linear programming decoding.

We also collect statistics on the number of integer constraints required to decode. Integer constraints slow the LP solver considerably as compared to regular linear constraints. FIG. 4 shows the number of integer constraints as a function of the number of bit flips. The top line 401 is the worst case number of iterations, the next line 402 depicts the $95^{th}$ percentile—95% of the simulations at each bit flip level took at most the indicated number of integer constraints to find the ML codeword. We also indicate the $90^{th}$ percentile 403 and the $50^{th}$ percentile 404 (the median). Note that the worst case is much worse than even the $95^{th}$ percentile. These numbers combine all decodings (successes and failures). Recall that we imposed a cap of 200 ALP decoding iterations on our decoder. This cap is reached only very rarely and only at the highest bit flip levels. In our simulations, the cap is reached at least once only at 20, 22, and 23 bit flips. For all other numbers of bit flips, the cap is never reached.

By comparing FIG. 4 and the table in FIG. 3, one can see that the number of integer constraints has a large impact on the decoding time. FIG. 4 shows that the median case for 12, 14 and 16 bit flips is zero integer constraints. This means that the median case is performing ALP decoding without integer constraints.

Turning to the table of FIG. 3, this means that the corresponding median decoding times—0.12, 0.15, 0.23 seconds—tell us the decoding time requirements of ALP decoding without integer constraints. In contrast, the corresponding average decoding times—0.14, 0.22, 0.87 seconds—tell us the average decoding time requirement of ML decoding via mixed-integer ALP decoding. Thus, a $10^3$ to $10^5$ improvement in error rate requires only a small increase in average decoding time.

For higher noise levels, e.g., when there are 18 or 20 bit flips, the median case uses a positive number of integer constraints. The corresponding median decoding times increases sharply, to 1.33 and 20.6 seconds, respectively.

Effect of the Invention

We describe a method for adding integer constraints to an ALP decoder to find the ML codeword. We exploit the computational efficiency of adaptive LP decoding to speed up our method. We apply the decoder to a (155, 64) LDPC code, which is a surprisingly long code for which to obtain ML decoding performance.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for decoding a sequence of symbols received via a channel to a codeword of an error-correcting code, comprising the steps of:
   determining log-likelihood ratios from a sequence of symbols received via a channel;
   initializing a set of constraints according to the log-likelihood ratios;
   applying an adaptive linear programming decoder to the set of constraints and the log-likelihood ratios according to an error-correcting code to produce an estimate of the codeword and an updated set of constraints;
   determining if the estimate of the codeword is a non-integer pseudo codeword; and
   updating further the set of updated constraints with a set of integer constraints if the estimate of the codeword is the non-integer pseudo codeword, and proceeding with the applying step, and otherwise producing the estimate of the codeword as the final codeword, wherein the steps are performed on a processor.

2. The method of claim 1, in which the channel corrupts the sequence of symbols due to noise.

3. The method of claim 1, further comprising:
   identifying a symbol $\hat{x}_i$ with a value closest to 0.5, as a least certain symbol, in which the index i*, of the least certain symbol $\hat{x}_i$ is $i^* = \arg_i \min |\hat{x}_i - 0.5|$; and
   adding an integer constraint $\hat{x}_i \in \{0, 1\}$ to the set of updated constraints.

4. The method of claim 1, further comprising:
   transmitting a codeword $x \in C$ via the channel, where C is the error-correcting code; and
   receiving a codeword y, which is a version of the codeword x that has been distorted by the channel, and in which $Pr[\hat{x}|y]$ is a probability that a particular codeword $\hat{x} \in C$ was transmitted given that the codeword y is received.

5. The method of claim 4, wherein the log-likelihood ratio for an $i^{th}$ symbol is $$\gamma_i = \log\left(\frac{Pr[y_i \mid x_i = 0]}{Pr[y_i \mid x_i = 1]}\right).$$

6. A system for decoding a sequence of symbols received via a channel to a codeword of an error-correcting code, comprising:
   means for determining log-likelihood ratios from a sequence of symbols received via a channel;

means for initializing a set of constraints according to the log-likelihood ratios;

an adaptive linear programming decoder configured to be applied to the set of constraints and the log-likelihood ratios according to an error-correcting code to produce an estimate of the codeword and an updated set of constraints;

means for determining if the estimate of the codeword is a non-integer pseudo codeword; and means for updating further the set of updated constraints with a set of integer constraints if the estimate of the codeword is the non-integer pseudo codeword, and proceeding with the applying step, and otherwise producing the estimate of the codeword as the final codeword.

* * * * *